MULTI-LAYER SEMICONDUCTOR ELECTROLUMINESCENT OUTPUT DEVICE

Filed Dec. 21, 1961

INVENTOR.
EGON E. LOEBNER
BY
L. A. Larson
ATTORNEY

United States Patent Office 3,270,235
Patented August 30, 1966

3,270,235
MULTI-LAYER SEMICONDUCTOR ELECTRO-LUMINESCENT OUTPUT DEVICE

Egon E. Loebner, Princeton, N.J., assignor to Radio Corporation of America, a corporation of Delaware
Filed Dec. 21, 1961, Ser. No. 161,124
7 Claims. (Cl. 313—108)

Figure 1:
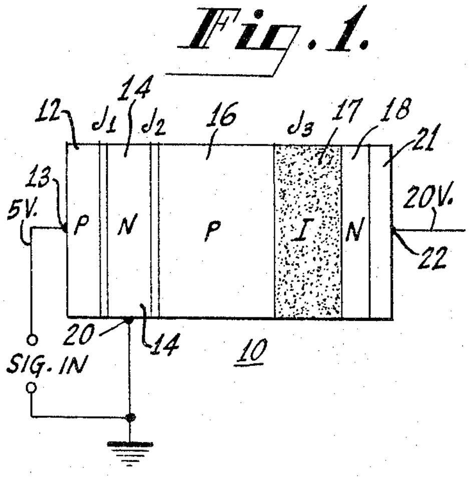

This invention relates to electroluminescent devices. In particular, this invention relates to an electroluminescent device of the type wherein a modulating electrical input signal produces a modulated optical output.

In the prior art, there are many structures which are designed to produce an optical scene in response to electrical input information. One group of these structures is known as electroluminescent devices. A particular example of these electroluminescent devices includes electrical modulation of the electroluminescent light output in a transistor-like structure. In these devices, minority carriers are injected into the transistor-like structure to produce electroluminescent radiation by recombination of the minority carriers with majority carriers whether free or localized.

In this type of structure, the minority carriers which make a successful transit through the base region do not contribute to the electroluminescent radiation output since the electroluminescence is produced by recombination in a region of high minority carrier density. Also, in these devices, any current amplification obtained in the device is a product of the injection efficiency and the transport factor, neither of which can exceed unity. An electrical power amplification of the injected signal is achieved in a transistor type of structure which has a current amplification factor that approaches unity. However, in transistor type structures used for electroluminescence, a large radiative recombination factor of injected carriers is desired to produce a large optical output. Thus, in the known devices, the high optical output is not compatible with a high current amplification factor and electrical power amplification.

It is therefore an object of this invention to provide an improved electroluminescent amplifier.

It is a further object to provide an improved electroluminescent device having positive electric modulation.

It is a further object of this invention to provide a novel electroluminescent device capable of producing power gain between a modulating electrical input signal and the resulting modulated optical output signal.

These and other objects are accomplished in accordance with this invention by providing an electroluminescent transistor in the form of a semiconductor body having at least four zones successively arranged and alternating in zones conductivity type, e.g. a p-n-p-n, p-n-p-i-n or p-i-n-p-n device. In this specification p and n zones are considered to have a conductivity type; whereas, the i or intrinsic zones are considered not to have a conductivity type. During operation of the electroluminescent transistor the two outer zones serve as emitter and collector, and a connection to one of the intermediate zones serves as a base. The first and third junctions are biased in the forward direction, while the second (or middle) junction is biased in the reverse direction. The signal input is injected so that current amplification is efficiently produced in the first two junctions of the device, e.g. p-n-p, and radiative recombination, of the now amplified current, is efficiently produced near or within the third junction, or in the adjacent intrinsic region if a substantial intrinsic region is present, so that the photons produced can escape through the final region and thus produce modulated light output.

Figure 2:
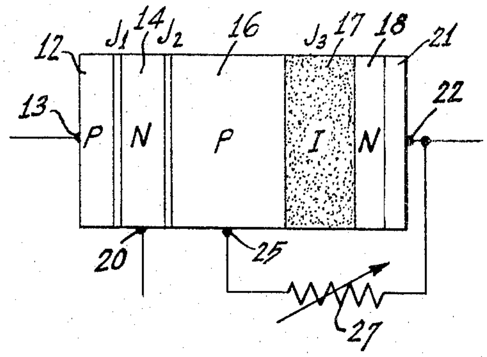
Figure 3:
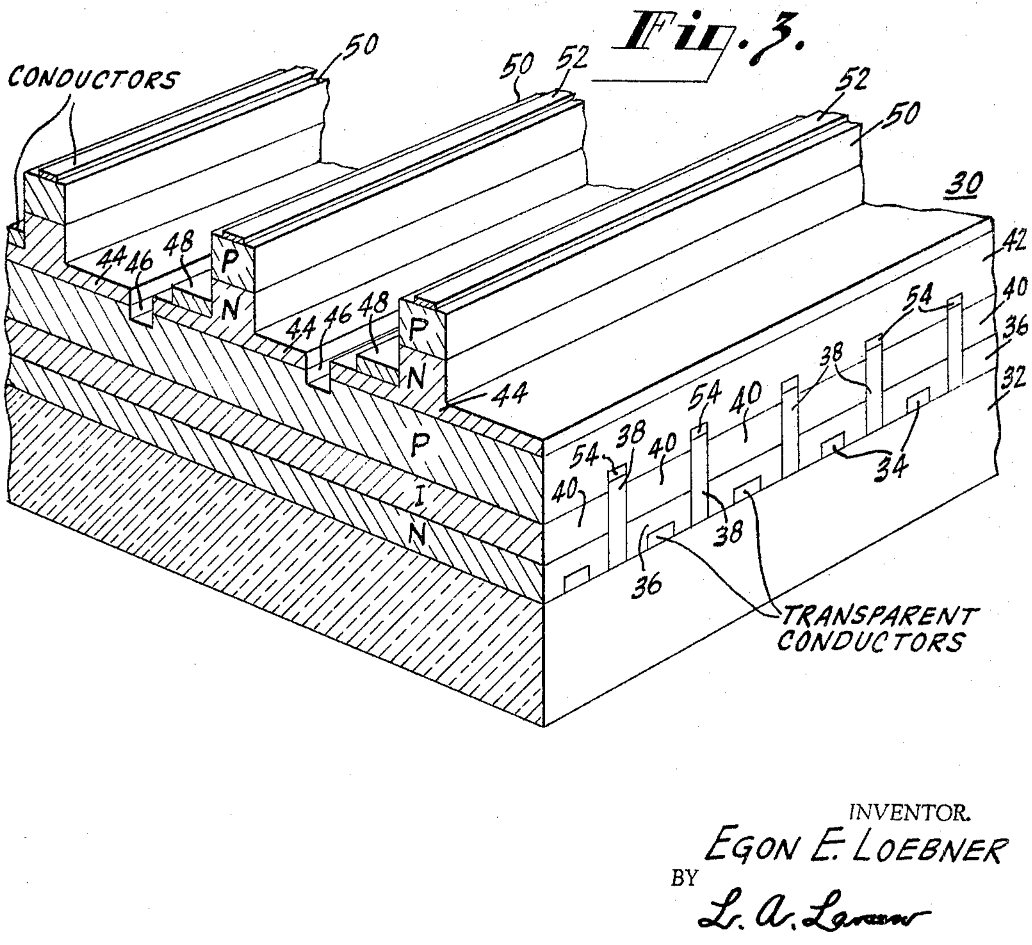

The invention will be more clearly understood by reference to the accompanying single sheet of drawings wherein:

FIG. 1 is an enlarged schematic view of an elemental unit of an electroluminescent transistor in accordance with this invention, FIG. 2 is an enlarged schematic view of an elemental unit of an embodiment of an electroluminescent transistor in accordance with this invention; and FIG. 3 is a partial perspective view of an image reproducing panel made in accordance with this invention and utilizing a large number of the elemental units illustrated in FIG. 2.

Throughout this application the term electroluminescence is defined as the production of visible or near visible, non-thermal, radiations caused by an electrical power input. In particular, the electroluminescence is of the injection type. Luminescence of this type is the production of light through a process by which minority carriers are first created by an electrical means, e.g. by a forward biasing of a p-n junction; the minority carriers are then injected into a region where majority carriers predominate. The latter injection is then followed by a recombination process of the minority carriers with the majority carriers, either direct or through a number of excited states, such as excited impurity centers or excitons. This recombination process sometimes occurs in conjunction with the emission or absorption of a photon. The emission of light by this recombination process is employed in operating the apparatus of the present invention.

The term modulation is defined as the continuous control of energy flowing through a device from an input port of the device to an output port of the device in accordance with a signal. The energy in the device, and the energy passing through any of the ports, may be in the form of electrical energy or optical energy. When positive modulation occurs, the energy or power input is controlled as well as the output energy of the device.

Referring now to FIG. 1 there is shown an elemental unit 10 of a p-n-p-i-n positive modulation type, electroluminescent amplifier in accordance with this invention. In this figure the elemental unit 10 of an electroluminescent amplifier comprises a p-type emitter region 12 having an emitter electrode 13 connected thereto. On the p-type emitter region 12 is an n-type base region 14 and forming a first junction J1 with the p-type emitter region 12. Connected to the n-type base region 14 is a base electrode 20. In contact with the n-type base region 14 is a floating p-type region 16. The n-type region 14 and the p-type region 16 form a second junction J2. Adjacent to the floating p-type region 16 is an intrinsic region 17 and a relatively thin n-type collector region 18. The p-type region 16 and the n-type region 18 form a third junction J3 through the intrinsic region 17. On the n-type region 18 is a transparent collector electrode 21. All of the connections to the device 10 are essentially ohmic.

The p-type region 16, or the intrinsic region 17, if a substantial intrinsic region is used, are made so that a large number of radiative recombination centers are present in these regions. Also, the p-type region 16 and the intrinsic region 17 are designed so that some electrons from the n-type collector region 18 can pass into the n-type base region 14 but not sufficient numbers to cause a run-off avalanche in junction J2. In other words, for scene reproduction, the p-type region 16 and the intrinsic region 17 are designed, and the bias voltages are selected, so that the device 10 operates just short of the negative resistance region. Operation in this region normally gives rise to the switching behavior in p-n-p-n devices. If an electrically addressed optical memory system is desired, operation in the negative resistance region will produce such operation. The electroluminescent amplifier 10 may be made of any suitable materials. One example of such a material is gallium phosphide. To form the p-type regions 12 and 16, the gallium phosphide may be doped with zinc, e.g., a few tenths of an atomic percent of zinc. To form the n-type regions 14 and 18 the gallium phosphide material may be doped with selenium, e.g., a few tenths of an atomic percent of selenium. To form the intrinsic region 17 pure or highly compensated gallium phosphide can be used. To form the large number of radiative recombination centers in the intrinsic region 17, if one is used, or in the p-type region 16 if a substantial intrinsic region is not used, the gallium phosphide can be gradually grown in a quartz container which will produce a high amount of luminescent center forming defects which are not electrically active but which provide a region of highly efficient recombination centers for the production of light.

The operation of the p-n-p-n electroluminescent amplifier transistor comprises biasing the junctions J1 and J3 in the forward direction while the junction J2 is biased in the reverse direction. Suitable bias voltages by way of example are illustrated in FIG. 1. Carriers are injected, by means of the injection electrode 13, into the device 10 so that current amplification occurs in the p-n-p device 12, 14 and 16 by the proper bias across the junctions J1 and J2. Furthermore, a smaller current amplification also occurs in the n-p-i-n device 14, 16, 17 and 18 by the proper bias across the junctions J3 and J2.

Depending upon the relative voltages between the base connection 20 and the collector electrode 22, the amplified current from the p-n-p device 12, 14 and 16, is further modified by injection across the junction J3. However, little current amplification results in the n-p-n transistor from the current injected across the junction J3 since the vast majority of the carriers recombine to produce light in the intrinsic region 17. If only a very narrow intrinsic region 17 is used, the recombination occurs in the wide floating p-type region 16.

The radiative recombination centers are introduced only close to the junction J3 so that the photons that are produced by recombination of the amplified carriers are not strongly absorbed before escaping through the thin-n-type region 18 and through the transparent electrode 21.

The recombination rate of the electrons in the wide p-type region 16 is chosen so that the transport coefficient of the n-p-n device 14, 16 and 18 is not lowered below a value which would lower substantially the current amplification of the p-n-p-n transistor. The effect of photons reaching junction J2 from junction J3 has to be considered when establishing the required bias voltages.

The creation of a single carrier in the n-type region 14 requires an expenditure of energy of approximately 1/40 e.v. The photons have energies between 3/4 to 2½ e.v., depending on the materials used, thus giving a quality gain of the electroluminescent device of approximately 30 to 100. The quantum gain can also be greater than one since it depends upon the current amplification factor in the two coupled p-n-p and n-p-n devices.

Thus, the device 10 comprises a p-n-p transistor for high current amplification and an n-p-n transistor for high electroluminescent light producing efficiency.

Although the invention has been described with particular reference to devices wherein the semiconductive body is of p-n-p-n configuration with the end p-region operated as the emitter zone, it will be understood that it may be embodied in devices wherein the emitter zone is an n-type region and an n-p-n-i-p or an n-p-n-p electroluminescent device alternatively may be used. In either of these instances, the last p-type region is relatively thin so that the electroluminescent light is readily observable. In the n-p-n-i-p device the intrinsic region is relatively wide and has a large number of recombination centers. In the n-p-n-p embodiment, the last n-type region is relatively wide and includes a large density of recombination centers.

It should also be understood that the base connection 20 of FIG. 1 may be applied to the p-type region 16, with the n-type region 14 remaining floating.

Referring now to FIG. 2 there is shown an embodiment of an elemental unit of this invention wherein electroluminescence is produced and is modulated by two separate controls. This embodiment is the same as that shown in FIG. 1 except that in addition to the base connection 20 on the n-region 14, a control connection 25 is applied to the p-type region 16. In this embodiment, a variable resistance 27 connected between the control connection 25 and the collector electrode 22 provides a parallel electrical path for the minority carriers which otherwise would recombine to produce the electroluminescence. Thus, as the impedance of the variable resistor 27 is decreased, the light output of the device will be decreased since more of these carriers will flow through the parallel variable resistance 27.

In more detail, assume that the injection terminal 13 is positive and the collector electrode 22 is negative, then the junctions J1 and J3 are biased in the forward direction while the junction J2 is biased in the reverse direction. Holes are injected from the p-type region 12 into the n-type region 14 and drift across the latter to produce a hole current across the junction J2. Similarly, electrons are injected from the n-type region 18 into the p-type region 16 and drift across the latter to produce an electron current across the junction J2.

The structure may be viewed as comprising a p-n-p element 12, 14 and 16 and a n-p-n element 18, 16 and 14 with the regions 12 and 18 as the emitter zones of the respective elements and the junction J2 as a collector junction common to the elements.

In FIGURES 1 and 2, with input signals applied between the injector terminal 13 and the base connection 20, an amplified current flows into the p-type region 16 where it will recombine, due to the high density of recombination centers in this region, to produce electroluminescent light. The amount of the electroluminescent light is modulated by the signal applied between electrodes 13 and 20. In FIGURE 2, the variable resistance 27 connected between control electrode connection 25 and the collector electrode connection 22 shunts the carriers which would have produced electroluminescent radiation if they had been permitted to enter the recombination region. Thus, the amount of radiation can also be controlled by shunting the carriers before recombination occurs through the variable resistor 27. Thus, the electroluminescent radiation can be modulated by applying input signals either between the emitter and base connections 13 and 20 and/or between the control and collector connections 25 and 22. As will become evident in connection with FIG. 3, these two controls permit the use of this invention as an *x-y* coordinate system so that any selected elemental unit or units, may be made to produce light of selected brightness levels.

It should be noted that in the embodiment shown in FIG. 2, both of the coordinate controls may be varied without switching the power supply potential that is applied between the emitter and collector electrodes. Thus, when a plurality of elemental units are used, a common base 20 and a common collector 22 connection may be used.

Referring now to FIG. 3 there is shown an embodiment of this invention utilizing a plurality of the elemental electroluminescent transistors 10. The electroluminescent panel device 30 is for the purpose of producing an optical image in response to electrical input signals. The device is designed so that any elemental unit or units, can be selected, and will produce a controlled amount of light output. The device 30 comprises a transparent support 32 which may be made of a material such as glass. On the transparent support 32 there are provided a plurality of transparent conducting strips 34. The strips 34 may be deposited by any known means such as by evaporation through a suitable mask (not shown). The transparent conducting strips 34 may be made of a material such as tin oxide or thin evaporated gold strips.

On the transparent conducting strips 34 and on the transparent support plate 32 are a plurality of separate n-type regions 36. Each of the separate n-type regions 36 covers and registers with a different one of the transparent electrically conducting strips 34. The electrical separation between the separate n-type regions 36 may be accomplished, for example, by using a transparent support member 32 having a plurality of upstanding ridges 38 with a different transparent conductor and a different n-type region positioned in the valleys between each pair of ridges.

On each of the n-type regions 36 there is provided a different intrinsic region 40. The intrinsic regions 40 are also separated from each other by the upstanding ridges 38.

Extending across the entire transparent support plate 32 and in contact with all of the intrinsic regions 40 is a continuous layer of p-type material 42. On the continuous p-type layer 42 is a plurality of n-type regions 44. Each of the n-type regions 44 is separated from an adjacent n-type region 44 by any conventional means such as a groove 46. On each of the n-type regions 44 is a base electrode connection 48 which may be made of a material such as tin. On top of each of the n-type regions 44 is a different p-type region 50. On the p-type regions 50 are a plurality of injector electrodes 52. It should be noted that the injector electrodes 52 extend parallel to the p-type regions 50.

The transparent conductors 34, the n-type regions 36 and the intrinsic regions 40 extend in a first direction across the transparent support plate 32. The p-type region 42 is continuous in both directions. The n-type region 44, the p-type region 50 and the base conductors 48 and the injector electrodes 52 extend in the same direction and this direction is transverse to the direction of the transparent conductors 34. In this case, the transparent collector electrodes 34 extend perpendicularly to the base electrodes 48, forming an *x-y* coordinate system.

In the panel 30, each of the transparent electrodes 34 correspond to a collector electrode 22 of FIG. 1; and each of the conductors 52 correspond to the emitter electrodes 13 of FIG. 1. If desired a continuous base connection can be made to all of the n-type regions 44 since the strip like emitter connections 52 and the strip like collector electrodes 34 provide the *x-y* coordinate system required for selectively energizing any one or more elemental units of the electroluminescent panel 30.

To form a panel, of the type shown in FIG. 3, of the elemental units of the type shown in FIG. 2 the following changes of FIG. 3 can be utilized. First, the separate strip type collector electrodes 34 may be electrically connected together, or may be formed of a continuous conductive coating. The reason for this is that separate collector electrodes are not necessary to provide the *x-y* coordinate system in this embodiment. Provided on each of the glass pillars 38 is a separate strip like conductor 54 which corresponds to the control connection 25 of FIG. 2. Thus, the control connections 54 extend in one direction while the base connections 48 extend in a substantially perpendicular direction thereto to provide the *x-y* coordinate system. In this embodiment the supply voltage may be connected between a top electrode, i.e. the emitter, and the bottom electrode, i.e. the collector, both of which may be continuous electrodes. It should be noted that the supply voltage is not switched when selected elemental units are energized.

As was explained in connection with FIGS. 1 and 2 the light produced by either of the embodiments of FIG. 3 will be an amplified modulated light wherein current gain is produced within the electroluminescent transistor. The materials used for the n-p-n-i-p transistor shown in FIG. 3 may be similar to those previously described. It should be clearly understood that other known materials may also be used and that the gallium phosphide previously described was given solely as an example of a material which readily provides zones, or regions, of opposite conductivity type and which may be easily provided with a large density of radiative recombination centers in the desired region.

Entire images may be produced on the device 30 by selecting particular ones of the conductors 34, and 52 using the embodiment described in connection with FIG. 1 or conductors 54 and 48 using the embodiment described in connection with FIG. 2. By using a time varying signal, in series with switches between electrodes 54 and 34 or 48 and 52 a scene may be reproduced which includes gray scale areas as well as on-off areas. An electrically addressed optical memory may be obtained if device 30 is operated in the negative resistance mode across junctions J2 separating the regions 42 from regions 44. Such can be the case if the bias is increased or if optical feedback is arranged from junction J3 to junction J2.

Thus, applicant's invention provides a novel electroluminescent imaging device having the attributes of current gain and of efficient light production. Furthermore, in one embodiment, the supply voltage need not be switched during operation.

What is claimed is:

1. An electroluminescent device of the type which produces a modulated electroluminescent light output in response to a modulating electrical input, said device comprising a four layer structure forming a p-n-p-n transistor having two outer junctions and an inner junction therebetween, one layer between said inner junction and one of said outer junctions having a high density of radiative recombination centers, means for biasing said outer junctions in the forward direction and means for biasing said inner junction in the reverse direction.

2. An electroluminescent device comprising a semiconductive body having regions of different conductivity types successively arranged from an outer region and including at least three junctions, the region between said outer region and the second of said junctions having a high density of radiative recombination centers therein, means for biasing the first and third of said junctions in the forward direction, means for biasing the second of said junctions in the reverse direction, means for injecting carriers into said semiconductive body, and means for controlling the recombination rate of said injected carriers, whereby the electroluminescent light produced by said semiconductive body is controlled.

3. An electroluminescent panel comprising:

(a) a support plate, (b) a plurality of elemental units on said support plate, (c) each of said elemental units comprising a p-n-p-i-n structure forming junctions between adjacent p and n regions, (d) the i region of said p-n-p-i-n structure having a high density of radiation producing recombination centers therein, (e) means for applying potentials to the outer p and n regions of said p-n-p-i-n structure, and (f) means for applying signals to the inner n and p regions of said p-n-p-i-n structure.

4. An electroluminescent light producing panel comprising:

(a) a plurality of elemental units, (b) each of said elemental units comprising a semiconductive body having regions of different conductivity and comprising at least three junctions, (c) means for biasing the first and third of said junctions in the forward direction, (d) means for biasing the second of said junctions in the reverse direction, (e) means for injecting carriers into said elemental units, and (f) means for controlling the recombination rate of said injected carriers whereby the electroluminescent light produced by each of said elemental units is controlled.

5. An electroluminescent light producing panel comprising:

(a) a support plate, (b) a plurality of elemental units supported by means including said support plate, (c) each of said elemental units comprising a semiconductive body having at least four regions of opposite conductivity type whereby at least three junctions are formed, (d) means for biasing the first and third of said junctions in the forward direction and the second of said junctions in the reverse direction, (e) a high density of radiation producing recombination centers in said semiconductive body, and (f) a base connection means and a control connection means for controlling the recombination rate of carriers in each of said elemental units whereby the electroluminescent light produced by said panel is controlled.

6. An electroluminescent panel comprising:

(a) a transparent support plate, (b) a plurality of elongated transparent conductors on one surface of said support plate and extending across said support plate in a first direction, (c) a plurality of elongated n-type conductivity regions each registered with and on a different one of said transparent conductors, (d) a layer of p-type conductivity material on all of said elongated n-type regions and forming with each of said plurality of n-type regions a separate intrinsic region and a p-n junction through said intrinsic region, (e) each of said intrinsic regions being registered with one of said n-type regions, (f) a second plurality of elongated n-type regions on said layer of p-type material and forming a junction therewith, (g) said second plurality of elongated n-type regions extending over said support plate in a direction different from said first direction, (h) a plurality of elongated p-type regions each on a different one of said second plurality of n-type regions and forming a junction therewith and registered therewith, (i) means for applying potentials to said layer of p-type material, (j) means for applying potentials to each of said second plurality of elongated n-type regions, and (k) means for applying at least one potential to said plurality of elongated p-type regions.

7. An electroluminescent light display device comprising:

(a) a transparent support plate having a plurality of elongated ridges spaced apart on one surface thereof and extending in a first direction, (b) a plurality of elongated transparent conductors each being on said support plate and adjacent to a different one of said elongated ridges, (c) a plurality of elongated n-type regions each registered with and on a different one of said transparent conductors, (d) a plurality of elongated intrinsic regions each registered with and on a different one of said plurality of n-type regions, (e) a second plurality of elongated conductors each on top of and registered with a different one of said elongated ridges, (f) said second plurality of elongated conductors being positioned further from the base of said support plate than said intrinsic regions, (g) a continuous layer of p-type material on all of said intrinsic regions, and on all of said second plurality of conductors and forming a junction through said intrinsic regions with said plurality of n-type regions, (h) a second plurality of spaced apart elongated n-type regions on said layer of p-type material and extending in a second direction and forming a junction therewith, (i) a third plurality of elongated conductors each on a different one of said second plurality of elongated n-type regions and registered therewith, (j) a plurality of elongated p-type regions each on a different one of said second plurality of n-type regions and forming a junction therewith, and (k) a fourth plurality of elongated conductors each on a different one of said plurality of p-type regions and registered therewith.

References Cited by the Examiner

UNITED STATES PATENTS

| | | | |
|---|---|---|---|
| 2,655,610 | 10/1953 | Ebers | 307—88 |
| 2,817,783 | 12/1957 | Loebner | 313—108 |
| 2,928,036 | 3/1960 | Walker | 317—235 |
| 2,938,136 | 5/1960 | Fischer | 313—108 |
| 2,944,165 | 7/1960 | Stuetzer | 307—88.5 |
| 3,096,442 | 7/1963 | Stewart | 250—211 |
| 3,158,746 | 11/1964 | Lehovec | 250—199 |
| 3,160,828 | 12/1964 | Strull | 331—111 |
| 3,196,285 | 7/1965 | Hubner | 307—88.5 |

JOHN W. HUCKERT, *Primary Examiner.*

ARTHUR GAUSS, *Examiner.*

R. F. SANDLER, C. R. CAMPBELL, *Assistant Examiner.*